(12) United States Patent
Christensen et al.

(10) Patent No.: US 6,492,244 B1
(45) Date of Patent: Dec. 10, 2002

(54) METHOD AND SEMICONDUCTOR STRUCTURE FOR IMPLEMENTING BURIED DUAL RAIL POWER DISTRIBUTION AND INTEGRATED DECOUPLING CAPACITANCE FOR SILICON ON INSULATOR (SOI) DEVICES

(75) Inventors: Todd Alan Christensen, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/990,478

(22) Filed: Nov. 21, 2001

(51) Int. Cl.$^7$ ............................................. H01L 21/76
(52) U.S. Cl. .................... 438/404; 438/407; 438/162
(58) Field of Search ............................... 438/162, 489, 438/300, 305, 149, 457, 69, 27, 766, 407, 404, 412, 425; 57/347, 208

(56) References Cited

U.S. PATENT DOCUMENTS

| | | | | |
|---|---|---|---|---|
| 5,430,318 A | * | 7/1995 | Hsu | 257/350 |
| 5,689,432 A | * | 11/1997 | Blaauw et al. | 716/18 |
| 5,707,899 A | * | 1/1998 | Cerofolini et al. | 438/407 |
| 5,795,810 A | * | 8/1998 | Houston | 438/404 |
| 5,889,306 A | | 3/1999 | Christensen et al. | 257/350 |
| 5,930,642 A | * | 7/1999 | Moore et al. | 257/347 |
| 5,945,713 A | * | 8/1999 | Voldman | 257/355 |
| 6,013,936 A | * | 1/2000 | Colt, Jr. | 257/345 |
| 6,034,388 A | * | 3/2000 | Brown et al. | 257/296 |
| 6,034,397 A | * | 3/2000 | Voldman | 257/335 |
| 6,121,659 A | | 9/2000 | Christensen et al. | 257/347 |
| 6,287,901 B1 | * | 9/2001 | Christensen et al. | 257/347 |
| 6,383,892 B1 | * | 5/2002 | Colt, Jr. | 257/208 |
| 6,399,990 B1 | * | 6/2002 | Brennan et al. | 257/355 |
| 6,404,686 B1 | * | 6/2002 | Aipperspach et al. | 365/203 |
| 6,410,962 B2 | * | 6/2002 | Geissler et al. | 257/347 |
| 6,413,830 B1 | * | 7/2002 | Wahlstrom | 438/386 |

FOREIGN PATENT DOCUMENTS

JP    04180250    * 6/1992 ............... 21/76

* cited by examiner

Primary Examiner—Olik Chaudhuri
Assistant Examiner—Laura Schillinger
(74) Attorney, Agent, or Firm—Joan Pennington; Robert R. Williams

(57) ABSTRACT

Methods and semiconductor structures are provided for implementing buried dual rail power distribution and integrated decoupling capacitance for silicon on insulator (SOI) devices. A bulk silicon substrate layer is provided that defines one power distribution rail. A high energy deep oxygen implant is performed to create a deep buried oxide layer and a first intermediate silicon layer. The deep buried oxide layer is disposed between the bulk silicon substrate layer and the first intermediate silicon layer. The first intermediate silicon layer defines another power distribution rail. A lower energy oxygen implant is performed to create a shallow buried oxide layer and a second intermediate silicon layer. The shallow buried oxide layer is disposed between the first intermediate silicon layer and the second intermediate silicon layer. A connection to the bulk silicon substrate layer is formed without making electrical connection to the intermediate silicon layers. A connection to the first intermediate silicon layer is formed without making electrical connection to the second intermediate silicon layer.

10 Claims, 13 Drawing Sheets

METHOD AND SEMICONDUCTOR STRUCTURE FOR IMPLEMENTING BURIED DUAL RAIL POWER DISTRIBUTION AND INTEGRATED DECOUPLING CAPACITANCE FOR SILICON ON INSULATOR (SOI) DEVICES

FIELD OF THE INVENTION

The present invention relates to a method and semiconductor structure for implementing buried dual rail power distribution and integrated decoupling capacitor for silicon on insulator (SOI) devices.

DESCRIPTION OF THE RELATED ART

Fabricating smaller, more densely packed devices having greater computing capability is a continuing objective in building semiconductor devices. Silicon-on-insulator (SOI) technology is an enhanced silicon technology currently being utilized to increase the performance of digital logic circuits. By utilizing SOI technology designers can increase the speed of digital logic integrated circuits or can reduce their overall power consumption. These advances in technology are leading to the development of more complex and faster computer integrated circuits that operate with less power.

Silicon on insulator technology incorporates a buried insulator just below the transistors. Performance of silicon on insulator transistors is increased due to reduced diffusion capacitance and due to the floating body effect resulting in lower threshold voltages as compared to bulk silicon devices. However power supply decoupling capacitance is also reduced due to this same reduced diffusion capacitance and also due to the removal of well to substrate junctions, which supply significant desirable decoupling on bulk silicon products.

SUMMARY OF THE INVENTION

A principal object of the present invention is to provide a method and semiconductor structure for implementing buried dual rail power distribution and integrated decoupling capacitance for silicon on insulator (SOI) devices. Other important objects of the present invention are to provide such method and semiconductor structure for implementing buried dual rail power distribution and integrated decoupling capacitance for silicon on insulator (SOI) devices substantially without negative effect and that overcome many of the disadvantages of prior art arrangements.

In brief, methods and semiconductor structures are provided for implementing buried dual rail power distribution and integrated decoupling capacitance for silicon on insulator (SOI) devices. A bulk silicon substrate layer is provided that defines one power distribution rail. A high energy deep oxygen implant is performed to create a deep buried oxide layer and a first intermediate silicon layer. The deep buried oxide layer is formed between the bulk silicon substrate layer and the first intermediate silicon layer. The first intermediate silicon layer defines another power distribution rail. A lower energy oxygen implant is performed to create a shallow buried oxide layer and a second intermediate silicon layer. The shallow buried oxide layer is formed between the first intermediate silicon layer and the second intermediate silicon layer. A connection to the bulk silicon substrate layer is formed without making electrical connection to the intermediate silicon layers. A connection to the first intermediate silicon layer is formed without making electrical connection to the second intermediate silicon layer.

In accordance with features of the invention, transistors are built in the second intermediate silicon layer including device isolation oxides. A deep trench is formed that extends through one device isolation oxide in the second intermediate silicon layer, the buried oxide layers and the first intermediate silicon layer into the bulk silicon substrate layer. The deep trench is filled with a conductor to create a connection to the bulk silicon substrate layer without making electrical connection to the intermediate silicon layers. A second trench is formed that extends through the shallow buried oxide layer and the second intermediate silicon layer into the first intermediate silicon layer. The second trench is filled with a second conductor to create a connection to the first intermediate silicon layer without making electrical connection to the second intermediate silicon layer.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, methods and semiconductor structures are provided for implementing buried dual rail power distribution and an integrated decoupling capacitance for silicon on insulator (SOI) devices. The silicon-on-insulator (SOI) semiconductor structures of the preferred embodiment utilize an additional buried oxide insulator, allowing separate distribution of both power and ground rails and incorporating integrated power to ground decoupling capacitance.

Figure 1:
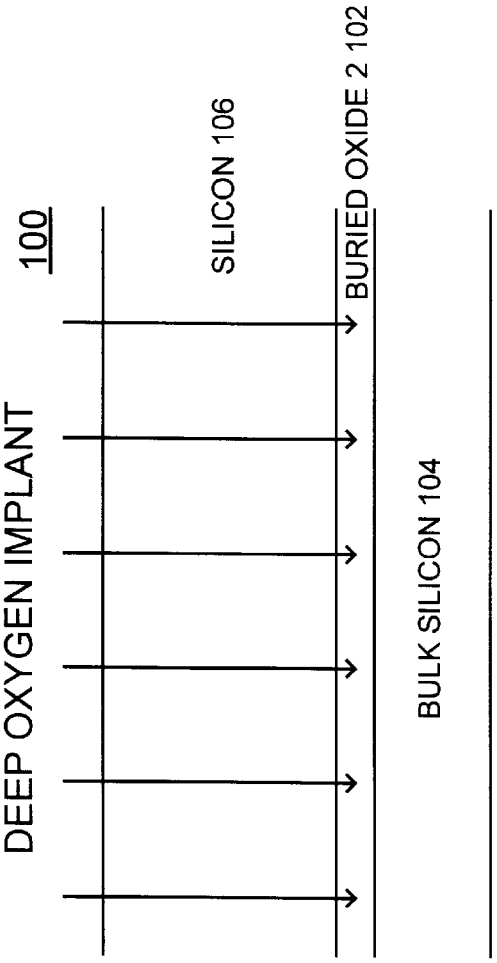
FIGS. 1–4 are schematic cross-sectional views illustrating exemplary processing steps for implementing buried dual rail power distribution and an integrated decoupling capacitance for silicon on insulator (SOI) devices of a first embodiment in accordance with the preferred embodiment.

Having reference now to the drawings, in FIGS. 1–4, there are shown exemplary processing steps for implementing buried dual rail power distribution and an integrated decoupling capacitance for silicon on insulator (SOI) devices in accordance with a first embodiment of the invention. A first exemplary SOI structure 100 of the preferred embodiment is built starting with the processing steps as shown in FIG. 1.

Referring to FIG. 1, building the SOI structure 100 begins by performing a very high energy deep oxygen implant to create a buried oxide 2 layer 102, such as buried silicon dioxide (SiO$_2$) or glass layer, between a bulk silicon layer 104 and a resulting silicon layer 106. Bulk silicon layer 104 and silicon layer 106 define the buried dual rail power supply distribution planes for the SOI structure 100.

Figure 2:
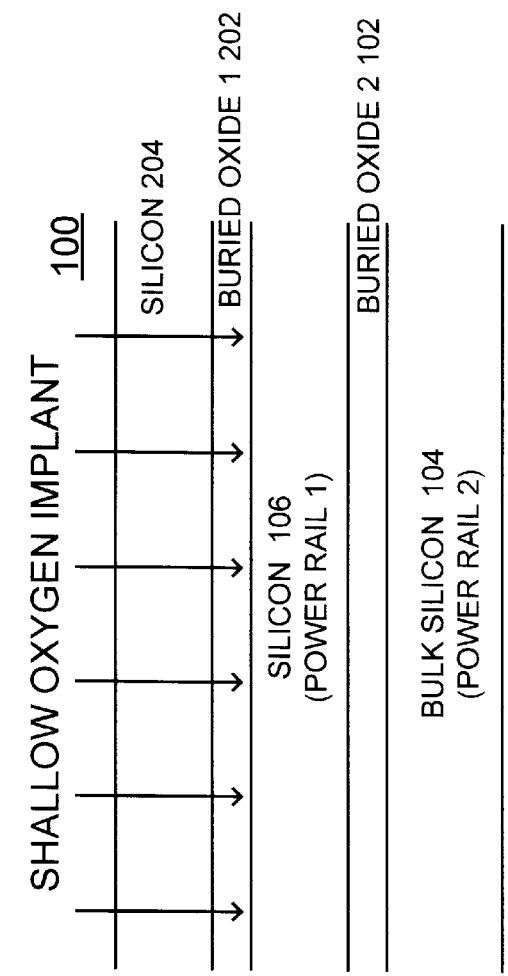

Referring to FIG. 2, next a shallow oxygen implant is performed with less energy that the first deep oxygen implant to form a buried oxide 1 layer 202, such as buried silicon dioxide (SiO$_2$) or glass layer, between the silicon layer 106 and a resulting second intermediate silicon layer 204. Buried oxide layer 1 202 define the silicon dioxide layer under the transistor devices to be formed in the active silicon layer 204.

In the preferred embodiment, the silicon layer 106 (power rail 1) below the buried oxide 1 layer 202 is used as either a ground or a power source and the bulk silicon substrate layer 104 (power rail 2) is used as the other of a power source or a ground. In a conventional SOI structure, a single buried layer is used as either a power source or a ground. In SOI structure 100, the buried dual rail power distribution including silicon layer 106 (power rail 1) and bulk silicon 104 (power rail 2) provides increased power supply to ground decoupling capacitance.

Figure 3:
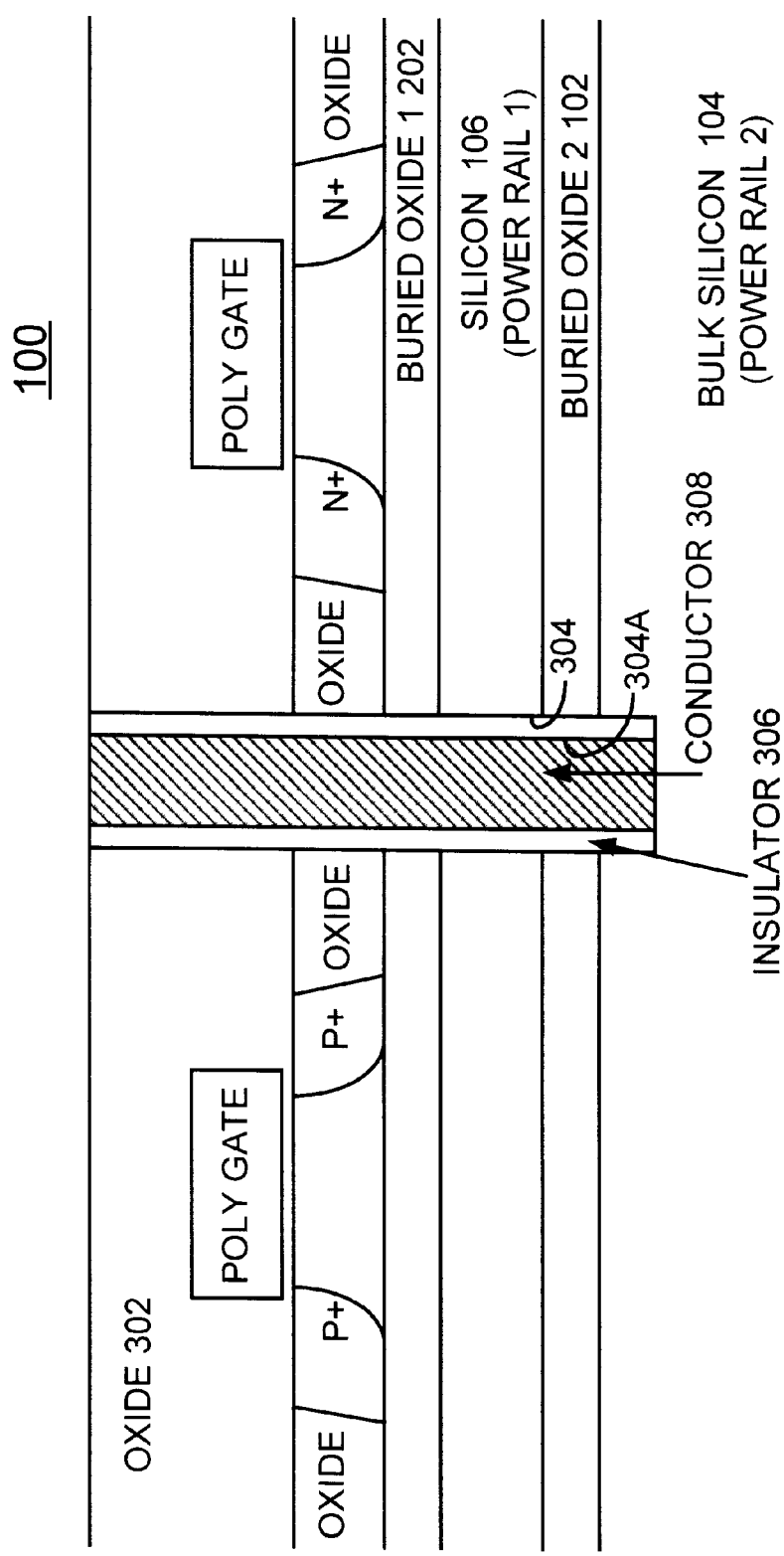

Referring to FIG. 3, transistors are then built in the active silicon layer 204 on top of the buried oxide 1 layer 202. The SOI transistors include a device isolation oxide (OXIDE), a body, a gate oxide, a gate polysilicon (POLY GATE) and the like formed by conventional transistor fabrication processes. Connections to be formed to the silicon layer 106 (power rail 1) and the bulk silicon substrate layer 104 (power rail 2) will extend through the device isolation oxide between the transistor bodies. After the transistors are formed an additional oxide layer 302 is deposited. Prior to applying a first metallization or metal 1 layer, a deep trench 304 is etched down into the bulk silicon substrate layer 104 through oxide layer 302, the transistor device isolation oxide, buried oxide 1 202, silicon layer 106 (power rail 1), and buried oxide 2. The location for deep trench 304 is defined by conventional photoresist technique. A thin dielectric is conformally deposited covering the entire interior of the trench 304 and a top surface of the oxide 302 and an anisotropic etch is performed to remove the insulator from the bottom of the trench 304 and to leave a thin layer of insulator 306 only on the sidewalls of trench 304 defining an insulated deep trench 304A. The thin layer of insulator 306 has a substantially uniform thickness generally less than 10% of the diameter of the trench 304. Etching of deep trenches 304 and the insulator 306 is done with an anisotropic etch process, for example, a reactive ion etch (RIE) process using plasma etchants. A electrically conductive conductor 308 is deposited into insulated trench 304A to make a connection from the first level of metal 1 to the bulk substrate 104 without connecting to the silicon layer 106 between the two buried oxides 102 and 202. Conductor 308 is formed of an electrically conductive material selected from the group including, for example, copper, conductive doped silicon, platinum, palladium, rhodium, aluminum, tantalum, titanium, tungsten and titanium-tungsten. Conductor 308 is deposited, for example, by conventional sputtering, evaporation, or chemical vapor deposition (CVD) processes so as to fill in the insulated opening 112A.

Figure 4:
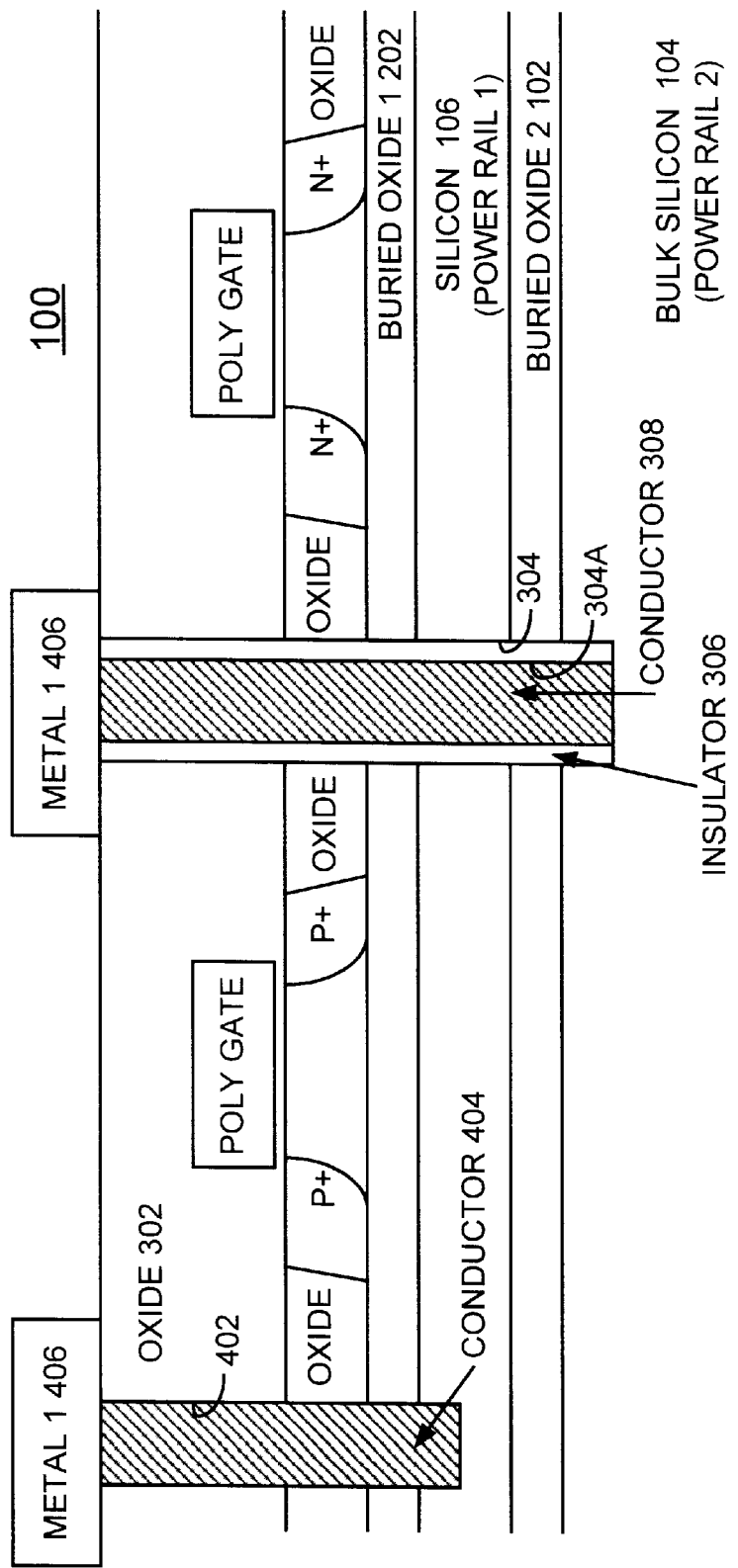

Referring to FIG. 4, a trench 402 is etched through the structure 100 into the silicon layer 106 and is then filled with a conductor 404. This second trench 402 does not need a sidewall insulator because the trench does not extend through other conducting planes. Then a first level metal 1 406 is deposited by conventional processing to complete separate power distribution connections to the buried dual rail power planes of bulk silicon substrate 104 and the first intermediate silicon layer 106.

While the bulk silicon layer 104 typically is connected to either the chip power supply or ground and the intermediate silicon level 106 is connected to the other power rail resulting in increased power supply to ground decoupling capacitance that reduces the noise level on the chip, it should be understood that the bulk silicon layer 104 and silicon layer 106 are not required to be used for power supply and ground connections. For example, the bulk silicon layer 104 and silicon layer 106 could be used for any signals or supplies that are used on a particular chip of interest, including local power supply gating, back biasing, and the like.

Figure 5:
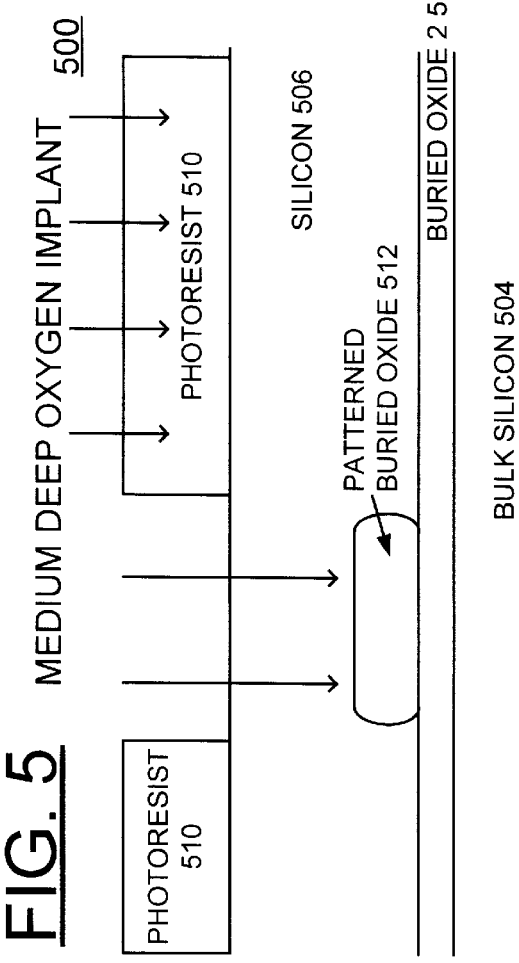
FIGS. 5–8 are schematic cross-sectional views illustrating exemplary processing steps for implementing buried dual rail power distribution and an integrated decoupling capacitance for silicon on insulator (SOI) devices of a second embodiment in accordance with the preferred embodiment.

Referring now to FIGS. 5–8, there are shown exemplary processing steps for implementing buried dual rail power distribution and an integrated decoupling capacitance for silicon on insulator (SOI) devices in accordance with a second embodiment of the invention. A second exemplary SOI structure 500 of the preferred embodiment is built starting with the processing steps as shown in FIG. 5. SOI structure 500 includes a patterned buried oxide 512, eliminating the need for the sidewall insulator 306 provided for the conductor 308 to the bulk silicon 104 of SOI structure 100.

Referring to FIG. 5, building the SOI structure 500 begins by performing a very high energy deep oxygen implant to create a buried oxide 2 layer 502, such as buried silicon dioxide (SiO$_2$) or glass layer, between a bulk silicon layer 504 and a resulting silicon layer 506. Bulk silicon layer 504 and silicon layer 506 define the buried dual rail power supply distribution planes for the SOI structure 500. Next photoresist 510 is applied and patterned and a slightly lower or medium deep energy oxygen implant is performed to create a patterned buried oxide 512 within the silicon layer 506 in areas in which a deep contact trench will be later etched down to the bulk silicon substrate layer 504.

Figure 6:
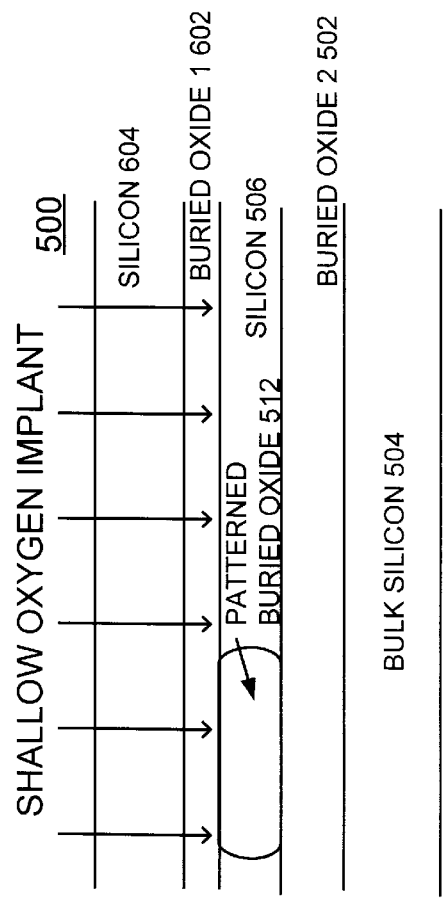

Referring to FIG. 6, a blanket high energy oxygen implant is performed with less energy that the medium deep oxygen implant to form a buried oxide 1 layer 602, such as buried silicon dioxide (SiO$_2$) or glass layer, between the silicon layer 506 and a resulting silicon layer 604. Buried oxide layer 1 602 defines the silicon dioxide layer under the transistor devices to be formed in the active silicon layer 604.

Figure 7:
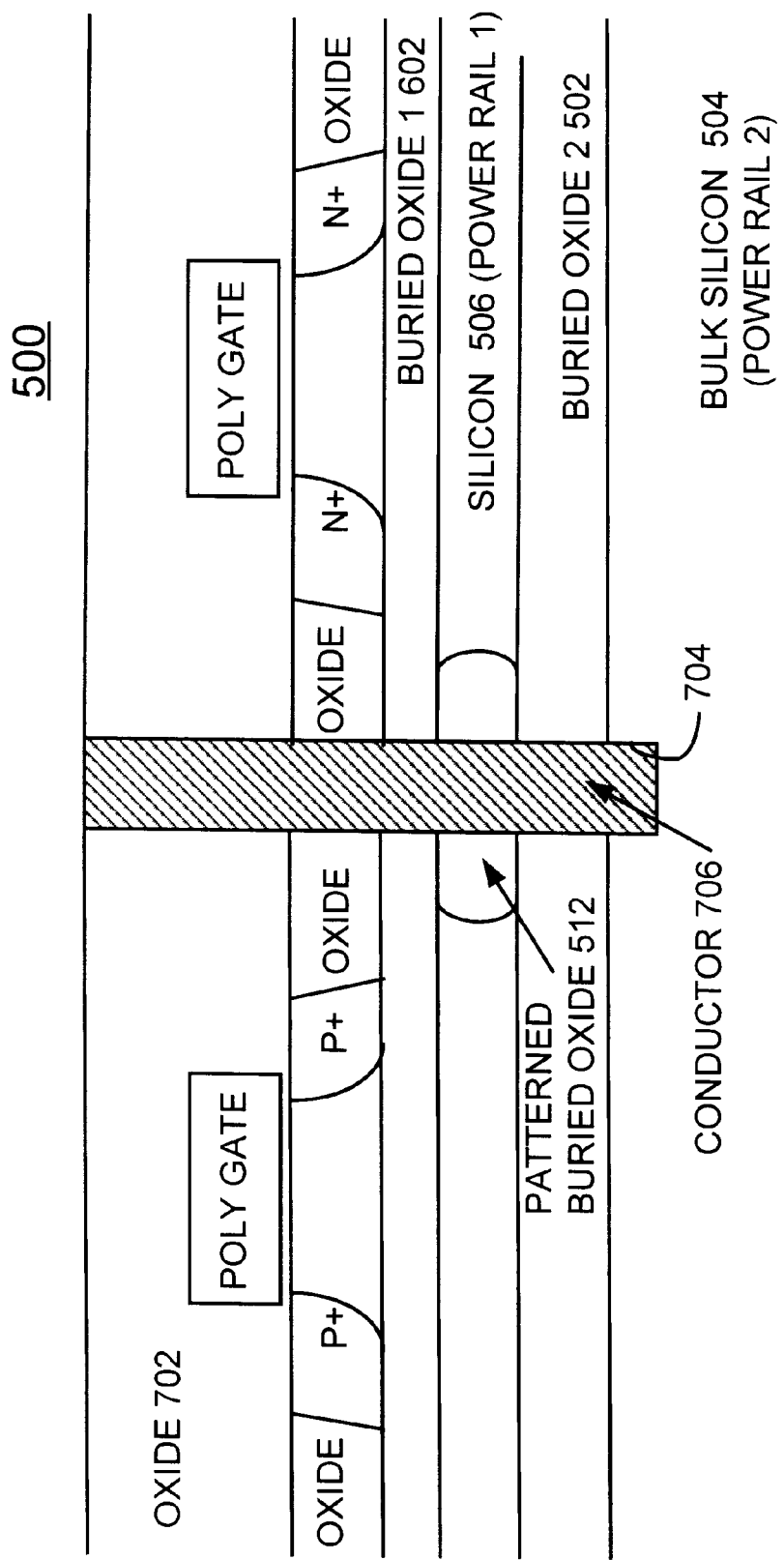

Referring to FIG. 7, conventional transistor building operations follow and an oxide layer 702 is deposited. Prior to applying a first metallization or metal 1 layer, a deep trench 704 is etched down to the bulk silicon layer 504 in the areas that are completely oxide including oxide 702, transistor isolation oxides, buried oxide 1 602, patterned buried oxide 512 and buried oxide 2 502. The trench 704 is then filled with a conductor 706. Since the trench 704 is etched entirely through oxide layers, there is no need for a sidewall insulator inside the trench.

Figure 8:
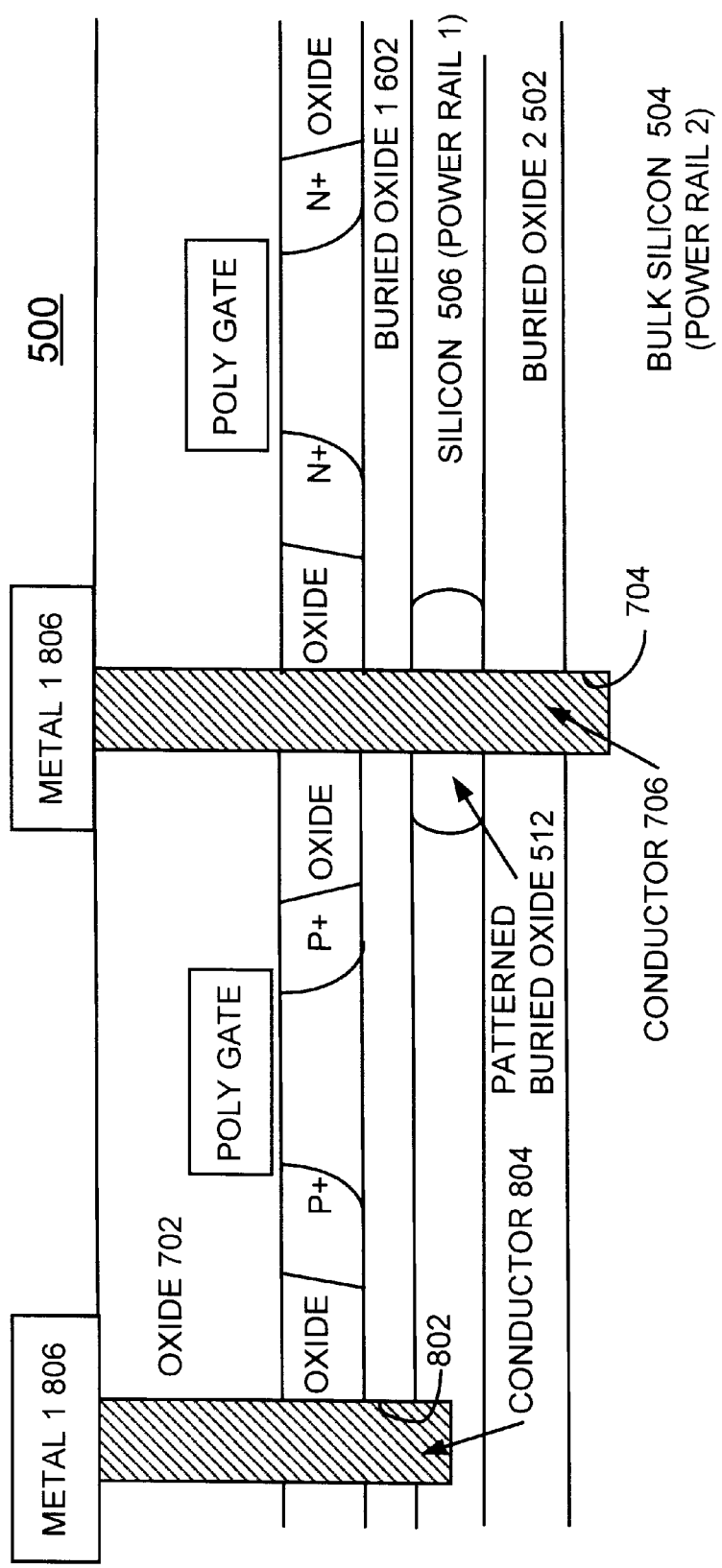

Referring to FIG. 8, a trench 802 is etched down through the structure 500 into the intermediate silicon plane 506 between the two buried oxides 502 and 602 as in the SOI structure 100 of FIG. 1. The trench 802 is then filled with a conductor 804. This second trench 802 does not need a sidewall insulator because the trench does not extend through other conducting planes. Then a first level metal 1 806 is deposited by conventional processing completing the SOI structure 500. The silicon layer 506 (power rail 1) below the buried oxide 1 layer 602 preferably is used as either a ground or a power source and the bulk silicon 504 (power rail 2) is used as the other of a power source or a ground.

Figure 9:
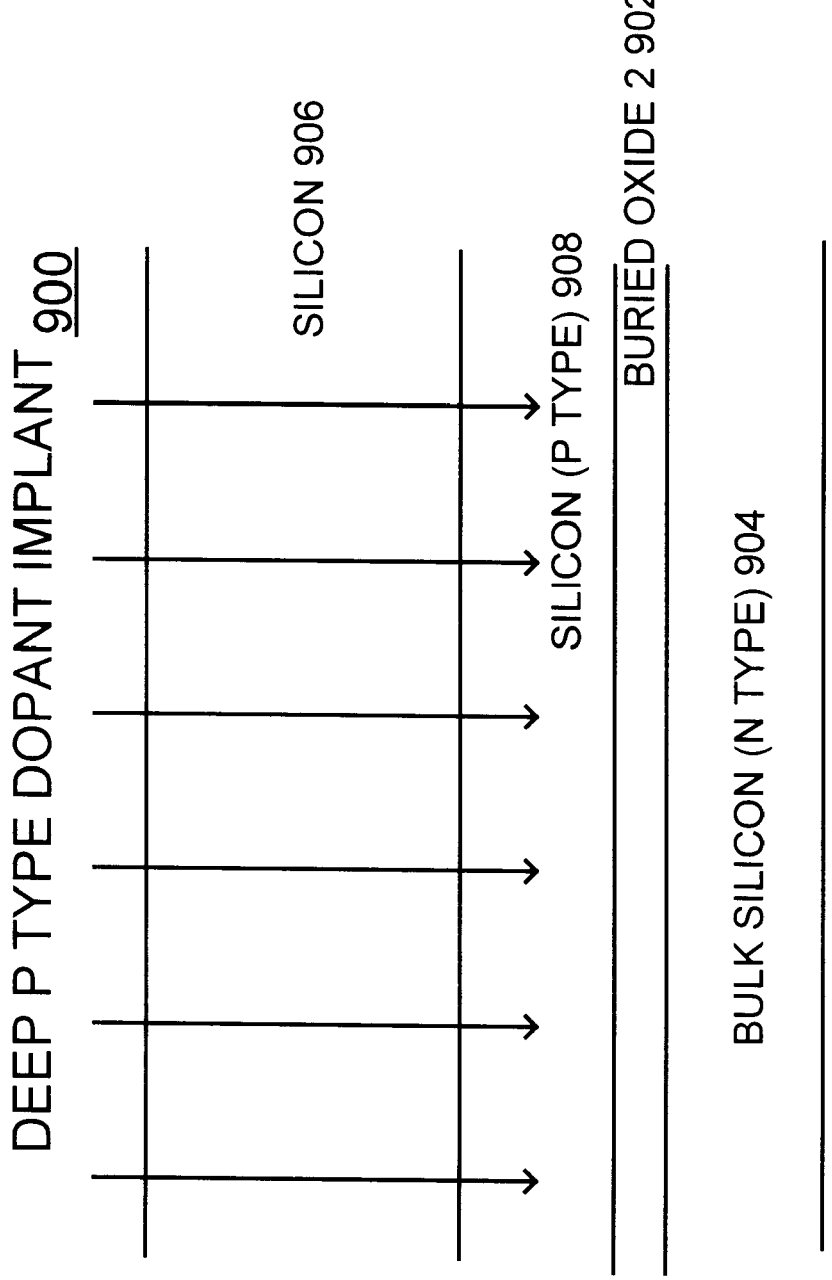
FIGS. 9–13 are schematic cross-sectional views illustrating exemplary processing steps for implementing buried dual rail power distribution and an integrated decoupling capacitance for silicon on insulator (SOI) devices of a third embodiment in accordance with the preferred embodiment.

Referring now to FIGS. 9–13, there are shown exemplary processing steps for implementing buried dual rail power distribution and an integrated decoupling capacitance for silicon on insulator (SOI) devices in accordance with a third embodiment of the invention. A third exemplary SOI structure 900 of the preferred embodiment is built starting with the processing steps as shown in FIG. 9. SOI structure 900 is similar to SOI structure 500 avoiding the need for a sidewall insulator on the deep trench used for connection to the bulk silicon layer. SOI structure 900 includes deep ion implants.

Referring to FIG. 9, building SOI structure 900 begins by performing a very high energy deep oxygen implant to create a buried oxide 2 layer 902, such as buried silicon dioxide ($SiO_2$) or glass layer, between a bulk silicon layer 904 and a resulting silicon layer 906. Bulk silicon layer 904 is an N type bulk silicon. A blanket deep dopant implant of opposite type or P type to the N type bulk silicon 904 is performed to dope an immediate silicon layer (P type) 908 above the deep oxide 2 layer 902. It should be understood that a P type bulk silicon layer and N type immediate silicon layer 908 can be used to create a structure of the invention. Bulk silicon N type layer 904 and silicon P type layer 908 define the buried dual rail power supply distribution planes for the SOI structure 900.

Figure 10:
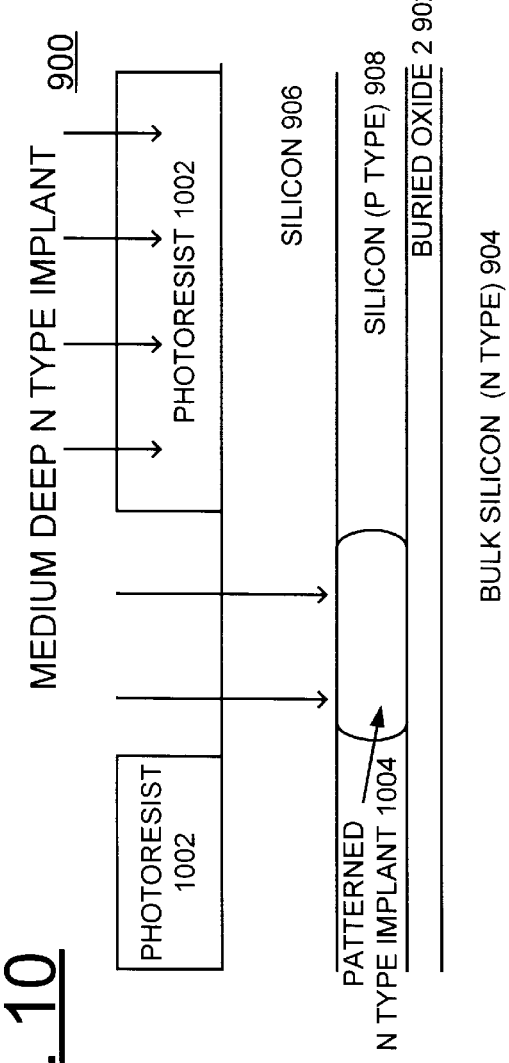

Referring to FIG. 10, next a photoresist 1002 is applied and patterned and a slightly lower or medium deep dopant implant is performed to create a patterned N type implant 1004 within the silicon P type layer 908 in areas in which a deep contact trench will be later etched down to the bulk silicon N type layer 904.

Figure 11:
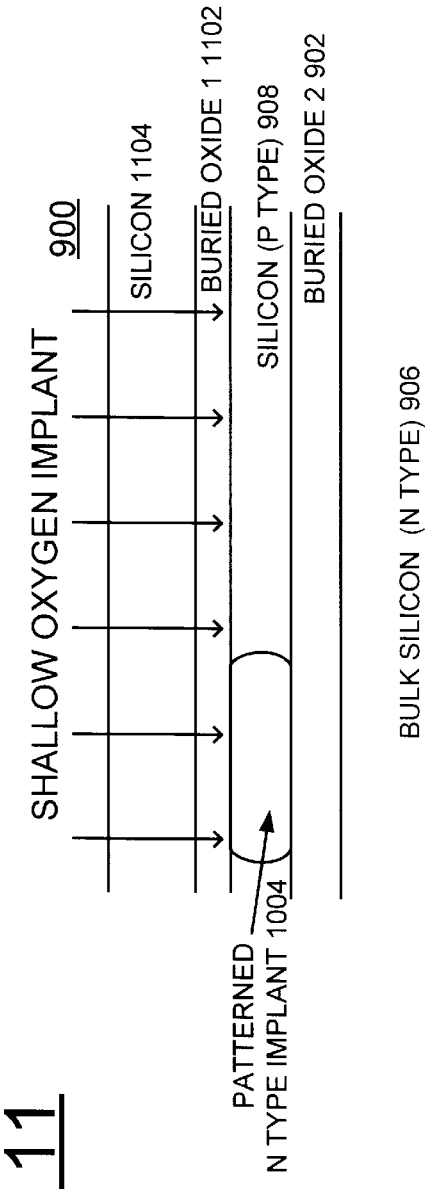

Referring to FIG. 11, a blanket high energy oxygen implant is performed with less energy that the medium dopant implant to form a buried oxide 1 layer 1102, such as buried silicon dioxide ($SiO_2$) or glass layer, between the silicon layer (P type) 908 and an active silicon layer 1104. Buried oxide layer 1 1102 defines the silicon dioxide layer under the transistor devices to be formed in the active silicon layer 1104.

Figure 12:
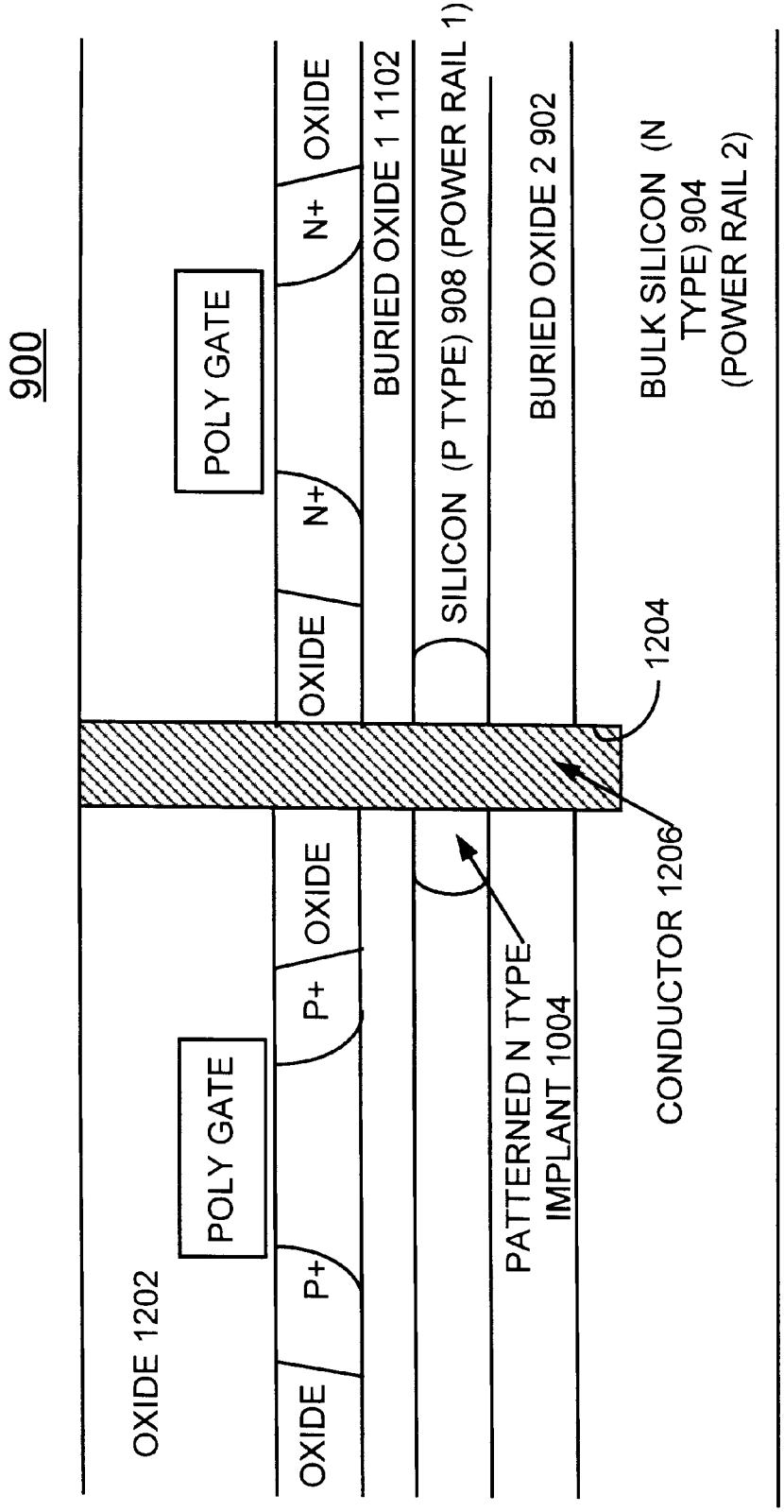

Referring to FIG. 12, conventional transistor building operations follow and an oxide layer 1202 is deposited. Prior to applying a first metallization or metal 1 layer, a deep trench 1202 is etched down to the bulk silicon N type layer 904 in the areas that contain the N type implant 1004 in the intermediate silicon 908 that is the same type as the bulk substrate. The deep trench 1202 is then filled with a conductor 1204.

Since the trench 1204 is etched entirely in an area that is the same dopant type as the bulk silicon N type substrate 904, there is no resistive connection to the intermediate silicon P type layer 908. The trench conductor 1206 makes contact to the doped silicon implant 1004 in the intermediate silicon P type layer 908 that forms a diode to the intermediate silicon P type plane. The diode connection further increases the decoupling capacitance between the bulk connection 904 and the intermediate connection 908.

Figure 13:
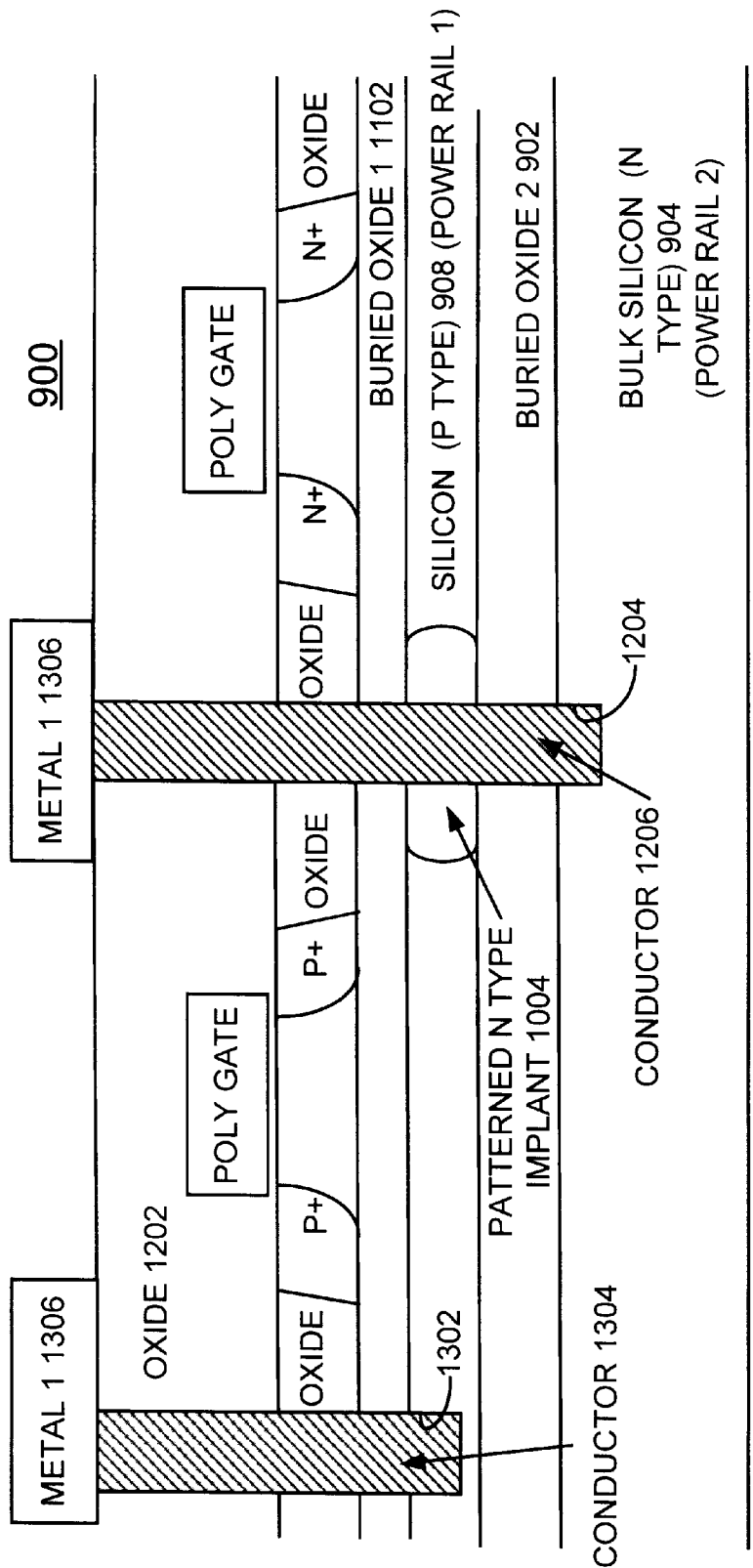

Referring to FIG. 13, a trench 1302 is etched down to the intermediate silicon plane 908 between the two buried oxides 902 and 1102 as in the first and second SOI structures 100 and 500. The trench 1302 is then filled with a conductor 1304. Then a first level metal 1 1306 is deposited by conventional processing completing the SOI structure 900. The silicon layer 908 (power rail 1) below the buried oxide 1 layer 1102 preferably is used as either a ground or a power source and the bulk silicon 904 (power rail 2) is used as the other of a power source or a ground.

Figure 14:
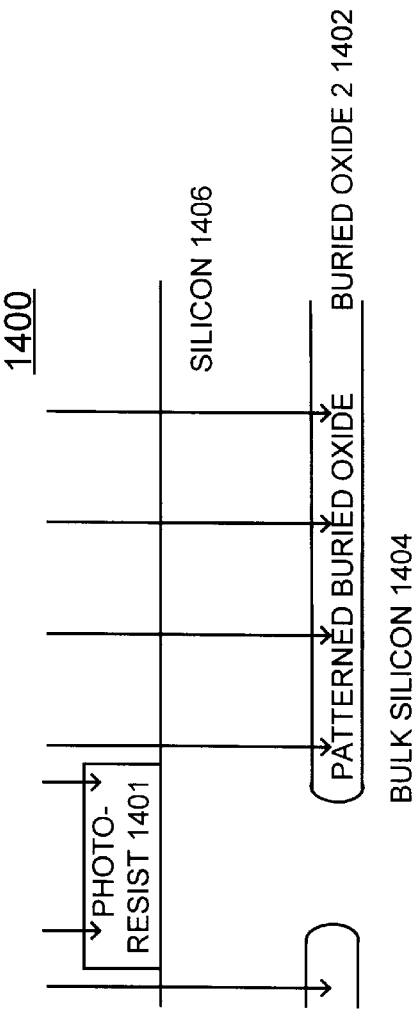
FIGS. 14–17 are schematic cross-sectional views illustrating exemplary processing steps for implementing buried dual rail power distribution and an integrated decoupling capacitance for silicon on insulator (SOI) devices of a fourth embodiment in accordance with the preferred embodiment.

Referring now to FIGS. 14–17, there are shown exemplary processing steps for implementing buried dual rail power distribution and an integrated decoupling capacitance for silicon on insulator (SOI) devices in accordance with a fourth embodiment of the invention. A fourth exemplary SOI structure 1400 of the preferred embodiment is built starting with the processing steps as shown in FIG. 14. SOI structure 1400 similarly avoids the need for a sidewall insulator on the deep trench used for connection to the bulk silicon layer and also enables the trench contacts to be etched simultaneously to make contact to both buried dual rail power distribution silicon planes.

Referring to FIG. 14, building SOI structure 1400 begins with depositing and patterning photoresist 1401. During a very deep oxygen implant to create a patterned buried oxide 2 layer 1402, such as buried silicon dioxide ($SiO_2$) or glass layer, between a bulk silicon layer 1404 and a resulting silicon layer 1406. The patterned buried oxide 2 layer 1402 is blocked where a trench connection to the bulk silicon layer 1404 will be made.

Figure 15:
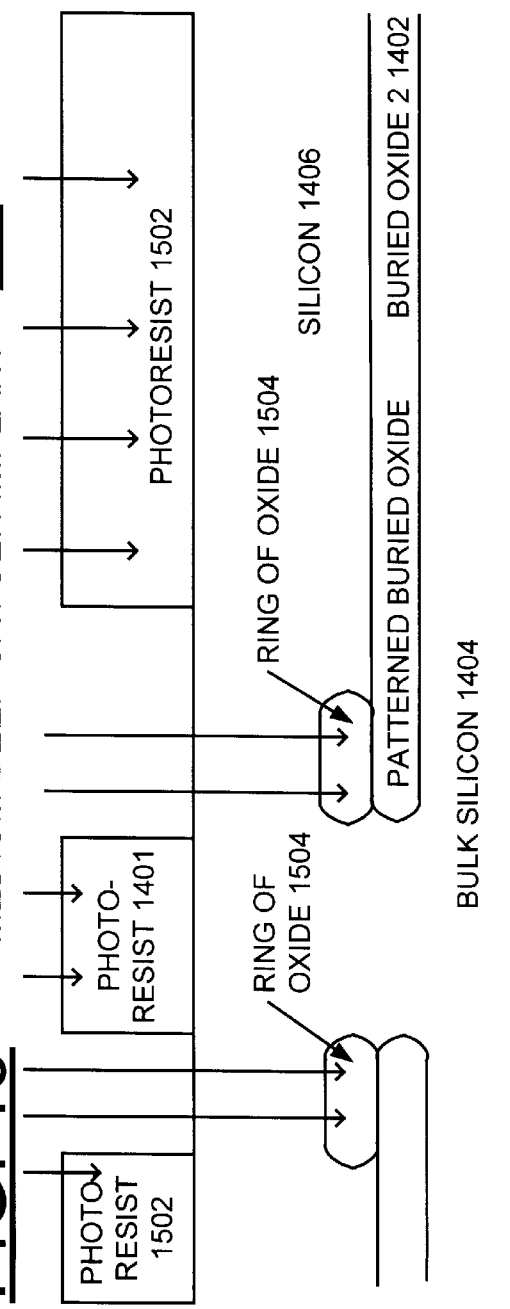

Referring to FIG. 15, next a photoresist 1502 is deposited and patterned and a slightly lower energy oxygen implant is performed in areas to define an oxide isolation ring 1504 in the intermediate silicon layer 1406 around the area where the very deep oxygen implant 1402 is blocked.

Figure 16:
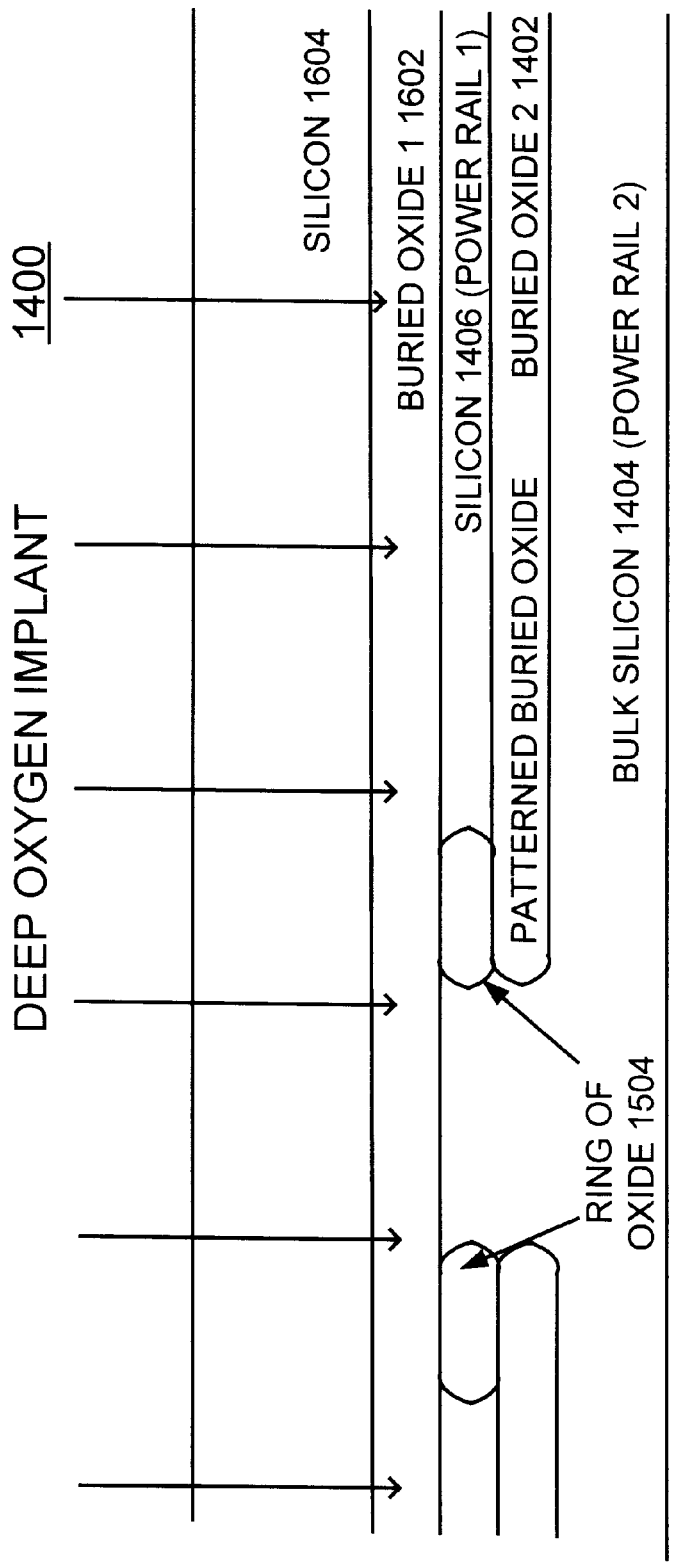

Referring to FIG. 16, a blanket deep oxygen implant is performed to create the upper buried oxide 1 1602, such as buried silicon dioxide ($SiO_2$) or glass layer, between the silicon layer 1406 and a resulting silicon layer 1604. Buried oxide layer 1 1602 defines the silicon dioxide layer under the transistor devices to be formed in the active silicon layer 1604.

Figure 17:
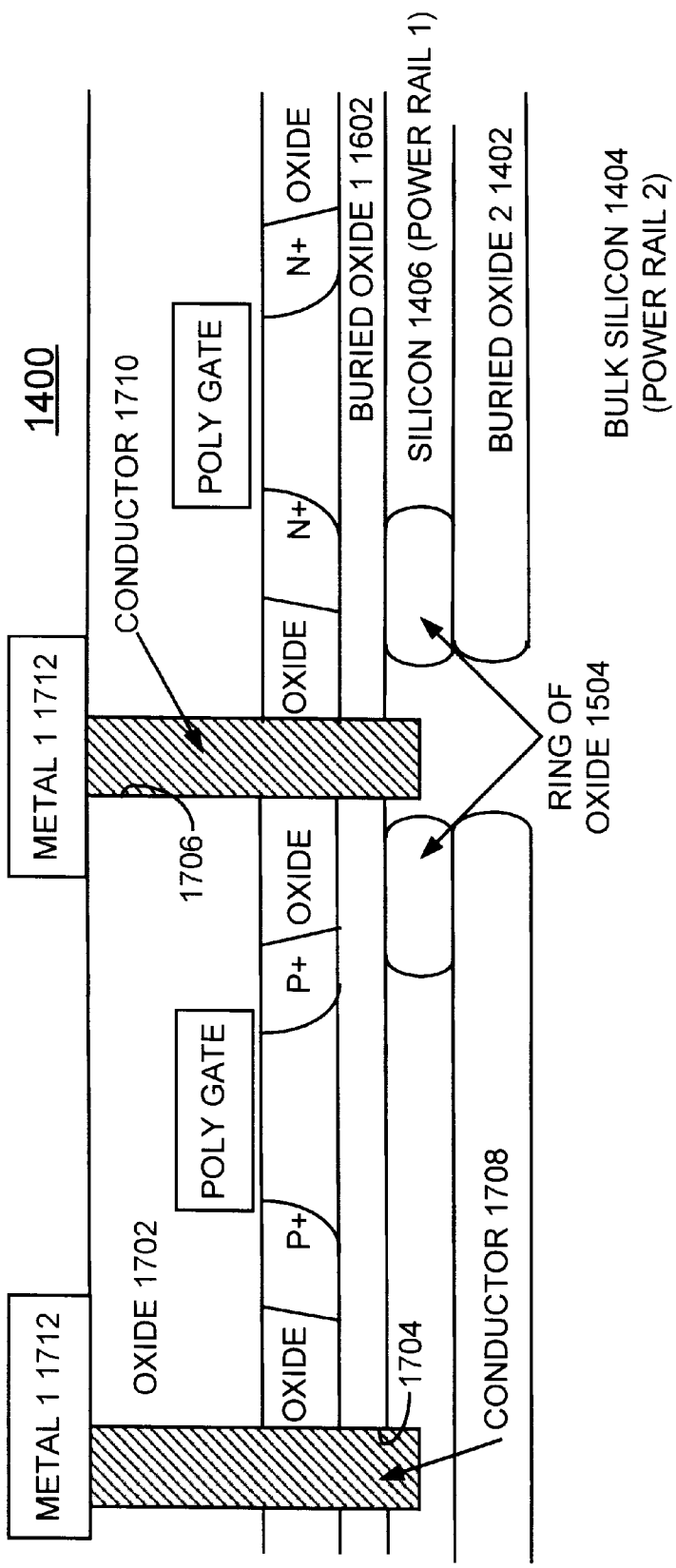

Referring to FIG. 17, conventional transistor building operations follow and an oxide layer 1702 is deposited. Prior to first level of metal, deep trenches 1704 and 1706 are etched simultaneously to make connection to the intermediate silicon layer 1406 and also within the area of isolation oxide ring 1504 to make connection to the bulk silicon layer 1404. These trenches 1704 and 1706 can be etched at the same time since these trenches extend down to the same level of the intermediate silicon layer 1406 in the SOI structure 1400. Since the trenches 1704 and 1706 are etched entirely through oxide layers, there is no need for a sidewall insulator inside the trenches. The trenches 1704 and 1706 are then respectively filled with a conductor 1708 and 1710. Then a first level metal 1 1712 is deposited by conventional processing completing the SOI structure 1400. The silicon layer 1406 (power rail 1) below the buried oxide 1 layer 1602 preferably is used as either a ground or a power source and the bulk silicon 1404 (power rail 2) is used as the other of a power source or a ground.

While the present invention has been described with reference to the details of the embodiments of the invention shown in the drawing, these details are not intended to limit the scope of the invention as claimed in the appended claims.

What is claimed is:

1. A method for implementing buried dual rail power distribution and integrated decoupling capacitor for silicon on insulator (SOI) devices comprising the steps of:

providing a bulk silicon substrate layer; said bulk silicon substrate layer defining one power distribution rail;

performing a high energy deep oxygen implant to create a deep buried oxide layer and a first intermediate silicon layer; said deep buried oxide layer formed between said bulk silicon substrate layer and said first intermediate silicon layer; said first intermediate silicon layer defining a second power distribution rail;

performing a lower energy oxygen implant to create a shallow buried oxide layer and a second intermediate silicon layer; said shallow buried oxide layer formed between said first intermediate silicon layer and said second intermediate silicon layer;

forming a first connection to said bulk silicon substrate layer without making electrical connection to said intermediate silicon layers; and forming a second connection to said first intermediate silicon layer without making electrical connection to said second intermediate silicon layer.

2. A method for implementing buried dual rail power distribution and integrated decoupling capacitor for silicon on insulator (SOI) devices as recited in claim 1 includes the step of building a plurality of transistors in said second intermediate silicon layer including device isolation oxides between transistors.

3. A method for implementing buried dual rail power distribution and integrated decoupling capacitor for silicon on insulator (SOI) devices as recited in claim 2 wherein the step of forming said first connection to said bulk silicon substrate layer without making electrical connection to intermediate silicon layers includes the steps of:

forming a deep trench extending through one said device isolation oxide, said shallow buried oxide layer, said intermediate silicon layer; and said deep buried oxide layer into said bulk silicon substrate layer;

forming a thin layer of insulator covering sidewalls of said deep trench with said bulk silicon substrate layer being exposed to define an insulated deep trench; and filing said insulated deep trench with a conductor to create said connection to said bulk silicon substrate layer.

4. A method for implementing buried dual rail power distribution and integrated decoupling capacitor for silicon on insulator (SOI) devices as recited in claim 2 further includes the step of performing a medium energy oxygen implant to create a patterned buried oxygen implant at a predefined location in said first intermediate silicon layer; and wherein the step of forming said first connection to said bulk silicon substrate layer without making electrical connection to said intermediate silicon layers includes the steps of:

forming a deep trench extending through said one said device isolation oxide, said shallow buried oxide layer, and said patterned buried oxygen implant in said first intermediate silicon layer into said bulk silicon substrate layer;

filing said deep trench with a conductor to create said connection to said bulk silicon substrate layer.

5. A method for implementing buried dual rail power distribution and integrated decoupling capacitor for silicon on insulator (SOI) devices as recited in claim 2 wherein said bulk silicon substrate layer comprises a selected type of doped bulk silicon substrate and further includes the steps:

performing a blanket deep dopant implant to create a dopant implant of an opposite type as said bulk silicon substrate type in said first intermediate silicon layer above said deep buried oxide layer; and performing a medium energy dopant implant to create a patterned dopant implant of a same type as said bulk silicon substrate type at a predefined location in said first intermediate dopant implant silicon layer;

and wherein the step of forming said first connection to said bulk silicon substrate layer without making electrical connection to said intermediate silicon layers includes the steps of:

forming a deep trench extending through said one said device isolation oxide, said shallow buried oxide layer, and said patterned dopant implant of said opposite type as said bulk type in said first intermediate dopant implant silicon layer into said bulk silicon substrate layer;

filing said deep trench with a conductor to create said connection to said bulk silicon substrate layer.

6. A method for implementing buried dual rail power distribution and integrated decoupling capacitor for silicon on insulator (SOI) devices as recited in claim 2 wherein the step of performing said high energy deep oxygen implant to create a deep buried oxide layer and a first intermediate silicon layer includes the steps of:

depositing and patterning photoresist during said high energy deep oxygen implant to create a patterned deep buried oxide layer; said patterned deep buried oxide layer being blocked at a predefined area;

depositing and patterning photoresist and performing a slightly lower energy oxygen implant to create an oxide isolation ring around said blocked predefined area in said first intermediate silicon layer;

and wherein the step of forming said first connection to said bulk silicon substrate layer without making electrical connection to said intermediate silicon layers includes the steps of:

forming a first trench extending through a first one of said device isolation oxides, said shallow buried oxide layer, and into said blocked predefined area in said first intermediate silicon layer inside said oxide isolation ring;

filing said first trench with a conductor to create said connection to said bulk silicon substrate layer.

7. A method for implementing buried dual rail power distribution and integrated decoupling capacitor for silicon on insulator (SOI) devices as recited in claim 6 wherein the step of forming said second connection to said first intermediate silicon layer without making electrical connection to said second intermediate silicon layer includes the steps of:

forming a second trench extending through a second one of said device isolation oxides said shallow buried oxide layer into said first intermediate silicon layer; said first trench and second trench being formed simultaneously; and filing said second trench with a second conductor to create said first intermediate silicon layer.

8. A method for implementing buried dual rail power distribution and integrated decoupling capacitor for silicon on insulator (SOI) devices as recited in claim 2 wherein the step of forming said second connection to said first intermediate silicon layer without making electrical connection to said second intermediate silicon layer includes the steps of:

forming a trench extending through one said device isolation oxide and said shallow buried oxide layer into said first intermediate silicon layer; and filing said second trench with a second conductor to create said first intermediate silicon layer.

9. A method for implementing buried dual rail power distribution and integrated decoupling capacitor for silicon on insulator (SOI) devices as recited in claim 1 includes the step of forming a first metal layer separately connecting a ground to said first connection to said bulk silicon substrate layer and a power source to said second connection to said first intermediate silicon layer.

10. A method for implementing buried dual rail power distribution and integrated decoupling capacitor for silicon on insulator (SOI) devices as recited in claim 1 includes the step of forming a first metal layer separately connecting a power source to said first connection to said bulk silicon substrate layer and a ground to said second connection to said first intermediate silicon layer.

\* \* \* \* \*